ated Jun. 14, 1983

United States Patent [19]
Shum et al.

[11] 4,388,347
[45] Jun. 14, 1983

[54] CONDUCTIVE PIGMENT-COATED SURFACES

[75] Inventors: Ming S. Shum, Des Plaines; Daniel S. Janikowski, Chicago; Steven A. Bradley, Northbrook, all of Ill.

[73] Assignee: UOP Inc., Des Plaines, Ill.

[21] Appl. No.: 379,208

[22] Filed: May 17, 1982

Related U.S. Application Data

[63] Continuation-in-part of Ser. No. 206,335, Nov. 11, 1980, abandoned.

[51] Int. Cl.³ .............................................. H05K 3/12
[52] U.S. Cl. ...................................... 427/96; 252/512; 252/513; 427/376.3; 427/376.7
[58] Field of Search .................... 427/96, 376.3, 376.7; 252/512, 513

[56] References Cited

U.S. PATENT DOCUMENTS 3,943,168  3/1976  Patterson .............................. 252/518
4,079,156  3/1978  Youtsey ................................ 427/96
4,130,854  12/1978 Hertz ..................................... 427/79
4,312,896  1/1982  Armstrong ........................... 427/96
4,317,750  3/1982  Provence ............................. 427/96
4,322,316  3/1982  Provence ............................. 427/96

Primary Examiner—John D. Smith
Attorney, Agent, or Firm—James R. Hoatson, Jr.; Raymond H. Nelson; William H. Page, II

[57] ABSTRACT

Conductive pigment-coated surfaces may be prepared by alloying a nonnoble conductive metal with an oxidizable material, admixing the alloy with an organic vehicle and a binder to form an ink followed by firing the ink in an oxidizing atmosphere containing about 20% by volume of oxygen at a temperature in excess of 1000° F. If so desired, a vitreous frit may also be present in the mixture. The resulting ink will possess desirable characteristics such as increased resistivity to oxidation, and increased firing strength when the oxidizable material such as boron is present in the alloy in an amount in the range of from about 12% to about 25% by weight.

12 Claims, No Drawings

CONDUCTIVE PIGMENT-COATED SURFACES

CROSS-REFERENCE TO RELATED APPLICATION

This application is a continuation-in-part application of our copending application, Ser. No. 206,335 filed Nov. 11, 1980, and now abandoned, all teachings of which are incorporated herein by reference thereto.

BACKGROUND OF THE INVENTION

The use of thick-film resistors, capacitors, etc. parts in microcircuits is becoming of increasing importance in the electrical and electronic field. These thick-film components which comprise a layer of ink or paste which may be conductive, partially conductive, semi-conductive or nonconductive in nature are deposited on a ceramic substrate by a process which is similar in nature to the silk screening method whereby a pattern of films is laid down to form conductors, dielectrics, resistors, capacitors or semi-conductors. Following the deposition of the film on the substrate, the resulting material is then fired to a temperature usually ranging from about 500° to about 1000° C. or more in air whereby the film is firmly affixed to the substrate. The resultant paste or ink substrate combination can form a microcircuit of passive components and, in addition, if so desired, discrete active components such as transistors or integrated circuit chips can be attached separately to form a thick-film hybrid device.

As hereinbefore set forth, the use of thick-film items or products is becoming more important due to the advantages which these items offer over other technology such as discrete parts, printed circuits, thin films, etc. For example, the designs which are used which have thick-film networks are easy, quick and flexible with low development costs and offer the design freedom and variety of parameter values which are normally available with discrete parts. Furthermore, circuits formed from thick films can combine many types of components such as high value capacitors, resistors, etc., which are not possible with monolithic products. In addition, the method of preparation of thick-film devices is simple inasmuch as the screen printing and heating processes are easy to control and automate. This is in contradistinction to thin-film networks which require a great degree of care in the sputtering and evaporating processes. The operation advantages which are possible when utilizing thick-film devices include high reliability which results from the use of fewer interconnection points. Furthermore, in contrast with discrete parts, the thick-film devices have improved resistance matching and temperature tracking capabilities.

All of the above-enumerated advantages will permit the use of thick-film devices in consumer radio and television products as well as in computers and in industrial electronic devices. These thick-film devices such as resistor networks may be used to replace the carbon resistor while hybrid modules including a thick-film device may be used in television circuits for the horizontal and vertical oscillators, high-voltage dividers and chroma signal processors. Additional uses for these devices are found in telephones, two-way radios, multiplexers, insulators, voltage regulators and heating aids. Likewise, these devices may also be used in industrial control systems such as analog-to-digital and digital-to-analog converters, operation amplifiers, servo amplifiers, power amplifiers and power supply regulators, while in the automotive field hybrid thick-film devices may be used in fuel injection systems. It is thus readily apparent that thick-film devices find a wide variety of uses in many fields.

The silk screen conductor pastes which are currently in use are produced by combining a noble metal pigment such as gold, silver, platinum, palladium, etc., with a powder glass mixture, an organic vehicle and an organic binder. Thereafter, the paste is silk-screened onto a ceramic substrate and thereafter taken through a firing cycle at a temperature in the range hereinbefore set forth which first burns off the organic vehicle and thereafter melts the glass frit. On cooling, the product is a distribution of metal pigment in a glassy matrix which possesses an electrical conductivity sufficient to produce minimal and predictable resistance in the electric circuit.

In view of the high cost of noble metal pigments and the extensive use of thick-film devices, there is a strong incentive to replace the noble metal pigments with less costly conductors. However, inasmuch as the firing of the pigment-vehicle paste is effected in air at temperatures above 500° C. and usually above 700° C., it has been found necessary to use the noble metals due to the resistance of these metals to oxidation. Heretofore, a drawback in using nonnoble conductive metals such as nickel or copper has been that these metals are subject to a relatively ready oxidation of the metal with the result that the conductivity of the nonnoble metal has been reduced to a point where it is insufficient in conductive properties to be useful in microcircuits.

Various U.S. patents have shown different inks. For example, U.S. Pat. No. 3,663,276 deals with inks which are used as resistors having a resistance greater than 100,000 ohms per square. However, this reference uses noble metals or noble metal oxides with nonnoble metals of given concentrations. The nonnoble metals oxidize upon firing, thus becoming nonconductive in nature and providing the desired high resistivity. Other U.S. patents such as U.S. Pat. Nos. 3,843,379, 3,811,906, and 3,374,110 describe utilizing a noble metal that is mixed with a vitreous frit, an organic binder, a solvent and is thereafter fired in an air atmosphere at an elevated temperature. These patents describe the use of noble metals such as gold, silver, palladium or mixtures thereof. As will hereinafter be shown in greater detail, the process of the present invention uses a nonoble metal alloy that can be air-fired under elevated temperatures, thus permitting the oxidation of the oxidizable material in preference to the nonnoble metals under the conditions of firing. While certain U.S. Patents such as U.S. Pat. Nos. 3,647,532 and 2,993,815 describe the use of nonnoble metals as conductive inks, it is necessary that these inks utilize a furnace with an accurately controlled special type atmosphere. For example, in the former patent, the firing is effected in an essentially neutral or inert atmosphere, except that it contains sufficient oxygen and claims that the upper limit of the oxygen which is present is 0.1% by volume. Furthermore, this reference also utilizes a reducing agent within the ink such as hydrazine hydrate which when decomposed at elevated temperatures releases hydrogen and reacts with excess oxygen, thus preventing oxidation of the base matter in the essentially neutral atmosphere. The purpose of the low oxygen content in this patent is to burn off the binder, but it cannot be any higher inasmuch as it will oxidize the conductive metal and render the ink electrically nonconductive. By utilizing this inert or essentially neutral atmosphere, the atmosphere is identical to a rare gas such as neon, argon, kyrpton, xenon, radon, etc., which show practically no tendency to combine with other elements. Therefore, an inert atmosphere is neither oxidizing nor reducing which is in contradistinction, as hereinafter set forth in greater detail, to the oxidizing atmosphere of the present invention. U.S. Pat. No. 2,993,815, hereinabove cited, uses two firing operations. The first firing is effected in an air, oxygen or mixed oxygen and inert gas environment so as to form the glass-metal bond. Following this, the second firing is effected in a reducing atmosphere possessing a critical composition of nitrogen, hydrogen and small amounts of oxygen to reduce the oxidized metal. Nonnoble metals such as copper, nickel, alloys of nickel and copper or iron when fired in an air atmosphere at 840° C. are known to oxidize rapidly and therefore will no longer be able to be utilized as conductive metals.

It is also known that reducing agents can be added to the glass frit. However, this produces spotty conduction zones. The addition of antimony, chromium, charcoal or other oxygen scavengers can be mixed or blended into the conductive ink, but on firing, reduction is nonuniform and will tend to occur only where the oxygen scavenger is present. U.S. Pat. No. 3,711,428 describes the mixing of charcoal with the ink. However, this action is taken to prevent blistering or cratering of the resistor, the charcoal burning off and thus leaving the metal exposed for oxidation. While this does not cause problems for the noble metal, there is substantial oxidation of nonnoble metals such as copper. Another U.S. Patent, namely U.S. Pat. No. 2,795,680, utilizes a ceramic base to which is bonded a cross-linked epoxy resin and a conductive and nonconductive powder. The resin is cross-linked at 250° C. which is well below the firing temperature which is utilized in the present invention. In the event that resistors need to be cofired, the conductor ink could not withstand the higher temperature.

In addition to the aforementioned references, U.S. Pat. No. 4,079,156 describes a conductive metal pigment which is prepared by alloying a nonnoble conductive metal with an oxidizable material followed by mixing the resulting alloy with a vitreous frit and an organic vehicle to form an ink. The ink is then screened onto a substrate followed by firing said ink in an oxidizing atmosphere containing at least 20% of volume of oxidation in a temperature in excess of about 500° C. The firing is effected for a period of time which is sufficient to utilize the oxidizable material without oxidation of the nonnoble metal. The oxidizable material is present in the alloy in an amount within the range of from about 0.1 to about 10% by weight of the alloy. The resulting ink or conductive pigment will hereinafter be used in the preparation of a thick-film device, the conductive of the conductive metal portion of the pigment being retained in an amount sufficient to permit the conductive pigment to be used in microcircuitry.

U.S. Pat. No. 3,943,168 discloses conductor compositions comprising nickel borides in which the compositions are finely divided inorganic powders comprising one or more compounds of nickel such as a mixture of nickel boride and nickel boride-silicide. It is also stated in this patent that the compositions may contain nickel metal powder in which the nickel powder may comprise up to 8% of the total weight of the nickel and nickel compounds present. Likewise, U.S. Pat. No. 4,130,854 discloses a borate-treated nickel pigment for metalizing ceramics, the borate coating forming a glass on the surface of the nickel powder, the borate forming an oxidation resistant film which aids in the adhesion of the nickel to the substrate.

However, as will hereinafter be shown in greater detail, it has now been discovered that by utilizing a critical amount of an oxidizable material in an alloy with a conductive nonnoble metal, it is possible to obtain improved characteristics of conductive pigments.

BRIEF DESCRIPTION OF THE INVENTION

This invention relates to a process for the preparation of conductive metal pigments. More specifically, the invention is concerned with a process for preparing conductive metal pigments by forming an alloy of a nonnoble conductive metal and at least one oxidizable material, said oxidizable material being present in a certain weight percent of the alloy, mixing this nonnoble conductive alloy with an organic vehicle followed by firing the mixture in an air atmosphere at a temperature in excess of about 1000° F. whereby the oxidation of said oxidatable material is effected without oxidation of the nonnoble conductive metal.

As hereinbefore set forth, in view of the relatively expensive cost of noble materials such as gold, platinum, palladium, silver, etc., it is an economical advantage for the manufacturers of conductive inks to utilize nonnoble metals when preparing conductive pigments for use in thick-film devices. However, the nonnoble metals must be able to withstand the oxidizing environment of the firing operation. The mixture of the conductive metal and organic vehicle, when silk screened onto the substrate and taken through a firing cycle, will burn off the organic vehicle. The oxide that is formed from the oxidizable material may also flow and aid the bonding of the particles. Therefore with this alloy, the vitreous frit is not always necessary. However, it is also contemplated within the scope of this invention that the conductive pigment may also contain a vitreous frit. Thus, when using ceramic substrates on which the conductive pigment is combined, the vitreous frit, which may be in the form of glass, can assist to both bind the metal particles which form the conductive portion of the pigment together and, in addition, will also act to bind the particles to the substrate. It is therefore necessary to fire the combination at such a temperature so that the glass will flow and also for particle sintering to occur and thus act in a manner to which it is intended.

The conductive pigment which is prepared according to the process of this invention will possess desirable physical and electrical properties which are greater than those which are found in conductive metal pigments which have been prepared according to methods set forth in other references. For example, the conductive metal pigment described in U.S. Pat. No. 4,079,156 possesses an acceptable adhesion rating with low resistances. However, it has been unexpectedly discovered that by utilizing a relatively greater amount of oxidizable material in the alloy, it is possible to obtain conductive metal pigments which possess an increased resistance to oxidation as well as an increased fired strength. The increase in resistance to oxidation is particularly beneficial inasmuch as it is necessary for the conductive metal pigment such as an ink to withstand multiple or longer term firings without a subsequent degradation. Another advantage which is found in the increased resistance to oxidation is that it would also improve solderability since this would be effected by an oxidized layer on the surface of a conductor. Likewise, the increase in fired strength would also afford an advantage inasmuch as the higher strength is necessary for the durability of an electric circuit utilizing this ink both in handling and in service. This is particularly true inasmuch as many of the connections would be of the clip contact type, a strong conductor being needed in order to withstand the clip pressure without flaking. It was totally unexpected that the presence of an increased amount of oxidizable material, of the type hereinafter set forth, in the conductive ink would contribute to the increased physical strength of the ink to such an extent as to render said ink utilizable in the aforesaid situations. This feature was unexpected in view of the fact that oxides of the type used to prepare the inks are generally brittle in nature and therefore, the addition of a greater amount of oxidizable material, which during the preparation of the conductive ink is converted to oxide, would be expected to decrease the physical strength of the ink as evidenced by adhesion measurements.

Another feature which was unexpected when utilizing a greater amount of an oxidizable material was that the conductivity of the pigment would be reduced. This was unexpected in view of the fact that oxidizable materials such as boron are nonconductive in nature and thus, when adding a greater amount of boron, it would be expected that the conductivity of the nonnoble conductive metal would not be effected. The advantage of preparing a conductive metal pigment utilizing relatively high proportions of oxidizable material with respect to the nonnoble conductive metal will be hereinafter shown in greater detail. When using the alloy containing a higher boron content, the use of a glass frit as a bonding agent was unexpectedly found to be optional and not always necessary.

It is therefore an object of this invention to provide a conductive metal pigment utilizing a nonnoble metal as the conductive element.

A further object of this invention is found in a process for preparing a conductive metal pigment such as an ink utilizing a nonnoble metal as the conductive element which is alloyed with an oxidizable material to provide the pigment with desirable characteristics.

In one aspect, an embodiment of this invention resides in a process for the preparation of a conductive pigment-coated surface which comprises alloying a nonnoble conductive metal with at least one oxidizable material selected from the group consisting of carbon, boron, silicon, boron-carbon and boron-silicon, mixing the resulting alloy with an organic vehicle to form an ink, screening said ink onto a substrate, thereafter firing said ink in an oxidizing atmosphere containing about 20% by volume of oxygen at a temperature in excess of about 1000° F. for a period of time sufficient to oxidize said oxidizable material without oxidation of said nonnoble metal, and cooling the thus fired product to produce a conductive pigment-coated surface, the improvement which comprises having said oxidizable material present in said alloy in a range of from about 12% to about 25% by weight of said alloy.

A specific embodiment of this invention resides in a process for the preparation of a conductive pigment-coated surface which comprises alloying nickel with boron, said boron being present in said alloy in a range of from about 12% to about 25% by weight of the alloy, mixing the resultant nickel-boron alloy with a vitreous frit, an organic vehicle, and an organic binder to form an ink, screening said ink onto a ceramic substrate, firing said ink at a temperature in the range of from about 1100° to about 1800° F. in an oxidizing atmosphere containing about 20% by volume of oxygen, and cooling the conductive ink to produce a conductive pigment-coated surface.

Other objects and embodiments will be found in the following further detailed description of the present invention.

DETAILED DESCRIPTION OF THE INVENTION

As hereinbefore set forth, it has now been discovered that a conductive pigment which is utilized in the preparation of a thick-film devise may be prepared by utilizing an alloy comprising a nonnoble metal as the conductive element in combination with an oxidizable material, said oxidizable material being present in the alloy in an amount in the range of from about 12% to about 25% by weight of the alloy. Inasmuch as the conductive materials of the nonnoble type which are usually utilized in circuits are relatively readily oxidized when heated in air, and that the usual method of preparing the conductive pigments for use in devices of the thick-film type were prepared by firing a combination of a conductive metal and a vehicle, therefore it is totally unexpected that such a pigment could be prepared in the usual manner when utilizing a nonnoble metal such as nickel or copper as the conductive element. The conductive pigment of the present invention is prepared by forming an alloy of a nonnoble conductive metal with at least one other material which is more readily oxidizable. It is known that carbon oxidizes very rapidly and will not produce a substrate as effectively as other reducing agents. Likewise, a nickel powder admixed with carbon powder does not possess relatively good conductivity. However, if a nickel-carbon alloy is prepared in a proper manner, it has been found that the oxidation of carbon in the alloy is slower than if the carbon in the form of charcoal is mixed in with nickel, probably due to the fact that in the alloy the carbon must diffuse through the lattice to the surface. An alloy which is correctly formed will prevent localized oxidation and will not leave sections of the fired ink either nonconductive or highly resistive. It is therefore necessary to form an alloy which is composed of two or more metals or elements, one of which comprises the nonnoble conductive metal while the other comprises an oxidizable material which is preferentially oxidized. By using such a preferentially oxidized material which includes, but is not limited to, carbon, boron, silicon, aluminum, etc., or combination of these metals such as carbon-silicon, boron-silicon, etc., it is possible to obtain the desired result. Thus, for example, a more mobile alloying element such as boron, carbon or silicon can diffuse through the crystal lattice at an elevated temperature, being preferentially oxidized and thus prevents oxidation of the conductive nonnoble metal. One of the benefits which is attained by practicing the present invention is that the presence of a vitreous frit or glass is not necessary inasmuch as the nonnoble metal alloy forms its own glass. By eliminating the presence of a vitreous frit or glass, the addition of a reducing agent becomes completely unnecessary for the preparation of a conductive pigment according to the process of the invention. Another benefit of the present invention is that the utilization of this particular type of nonnoble metal and readily oxidizable material alloy will produce uniformly thick films.

In one embodiment, the alloy, which is formed by combining a nonnoble conductive metal such as nickel, copper, aluminum, etc. and the preferentially oxidizable material of the type hereinbefore set forth, is admixed with an organic vehicle which, if so desired, may contain an organic binder to form an ink. Inasmuch as the preferentially oxidizable material will form its own glass, and one purpose of the glass is to bind the conductive pigment to a substrate of the type hereinafter set forth in greater detal, the presence of a vitreous frit will not be required in the formation of the ink. After screening said ink onto a substrate such as a ceramic which may be formed of alumina, silica-alumina, or ceramic-coated metal such as enameled steel, etc., the alloy is fired in an oxidizing atmosphere which is formed by the presence of an oxygen-containing gas such as air, oxygen, etc. The air firing operation which is effected at temperatures in excess of about 1000° F. accomplishes two important functions. The first function is that the base of nonnoble conductive metals such as nickel is not oxidized in the highly oxidizing atmosphere so that it remains highly and uniformly conductive, while the second function of the firing operation is that the preferentially oxidizable material forms the glass which fuses the particles together and to the substrate, thus acting as a barrier which will reduce the diffusion of oxygen into the nonnoble metal. The term "air atmosphere" as used in the present specification will refer to an atmosphere consisting of nitrogen, oxygen, carbon dioxide, etc. The components of this air atmosphere, exclusive of water vapor, as stated in the CRC Handbook of Chemistry and Physics consist of approximately 20.9% by volume of oxygen, 78.0% by volume of nitrogen, 0.33% by volume of carbon dioxide and 0.93% by volume of argon. Therefore, the oxidizing atmosphere in which the ink is fired will contain a lower limit of approximately 20% by volume of oxygen and may, if so desired, consist of 100% by volume when utilizing pure oxygen. After firing the alloy in this oxidizing atmosphere for a period of time which is sufficient to oxidize the preferentially oxidizable material without oxidation of the nonnoble conductive metal, the thus fired product is cooled and recovered.

In another embodiment, the vehicle which is utilized as one component of the conductive ink will usually comprise an organic binder with an organic solvent which is utilized to reduce or to obtain the proper viscosity of the mixture in order to silk screen the conductive ink onto the desired substrate. For example, the vehicle may be a mixture of resin binder such as ethyl cellulose while the organic solvent may comprise a low cost organic material such as pine oil. The substrate can be a ceramic such as alumina, silica-alumina, etc. The conductive ink consisting of a mixture of the conductive pigment and the vehicle may comprise from about 75% to 95% of the conductive pigment and from about 5% to about 25% organic vehicle. A vitreous frit content of 0.1% to 20% may also be included where specific properties of the fired ink may be modified. The frit may comprise a mixture of silica, alumina, calcia, lead oxide, sodium oxide and boron oxide in varying concentrations.

The alloys which comprise the starting material in the process of this invention may be prepared in any manner known in the art. For example, one method of preparing the alloy is to prepare a molten solution of the nonnoble conductive metal such as nickel or copper and the oxidizable material such as carbon, silicon, boron, aluminum, combinations of boron and silicon, boron and aluminum, boron and carbon, etc., following which the solution may be spray atomized to form spherical particles of the alloy. In this method, the material which is preferentially oxidized can be alloyed in the nonnoble conductive metal as a second phase, such as boron in nickel or copper and/or dissolved in the metal as a single phase. When the resulting alloy is utilized as a conductive pigment in a conductive ink formulation comprising the pigment and a vehicle which is thereafter silk screened onto a substrate and a resulting composite is then fired at a temperature above about 1000° F., the dissolved oxidizable material such as the carbon, silicon, boron, aluminum, etc., will diffuse to the surface of the nonnoble metal such as nickel or copper and is therefore available for preferential oxidation.

As will hereinafter be shown in greater detail, the oxidizable material will be present in the alloy in an amount in the range of from about 12% to about 25% by weight of the alloy in order to obtain optimum results with regard to reproducible resistivity as well as adhesive strength. The alloy comprising the nonnoble conductive metal and the oxidizable material may be fired at a higher temperature, usually in excess of 1500° F. and preferably up to about 1700° to 2000° F. for a relatively short period of time to effect a pigment which possesses increased firing strength and resistance to oxidation. Some respective examples of alloys which may be prepared according to the process of this invention to form the conductive metal pigments will include nickel plus silicon in which the silicon is present in an amount in the range of from about 12% to about 25% by weight; nickel or copper plus a mixture of silicon which may be present in a range of from about 6% to about 12.5% and boron which may be present in a range of from about 6% to about 12.5%; nickel plus boron, said boron being present in a range of from about 12% to about 25% by weight; nickel or copper plus carbon which may be present in a range of from about 12% to about 25% by weight; copper plus boron, said boron being present in a range of from about 12% to about 25% by weight; copper plus silicon in which said silicon is present in a range of from about 12% to about 25% by weight; aluminum plus boron which may be present in a range of from about 12% to about 25% by weight; aluminum plus silicon which may be present in a range of from about 12% to about 25% by weight, etc. It is to be understood that the above alloys are only representative of the class of alloys which may be utilized to prepare the conductive metal pigment, and that the present invention is not necessarily limited thereto.

As hereinbefore set forth, by utilizing an alloy of the type which has been exemplified in the foregoing specification, it is possible to air-fire a conductive ink containing this alloy as well as an organic vehicle which acts as a solvent plus a low temperature organic binder such as pine resin, ethyl cellulose, etc., and, if so desired, a high temperature binder such as vitreous frit or glass on a substrate in an oxidizing atmosphere at temperatures in excess of about 1000° F. and preferably in a range of from about 800° up to about 1750° F. or more to produce a conductive pigment in which the nonnoble conductive metal retains the desired conductive characteristics without imparting a deleterious effect on the conductive properties of the metal. The use of this type of firing technique insures that the base conductive metal is not oxidized to such a state whereby it will not be highly and uniformly conductive but will possess an increased resistance to oxidation, will also possess an increase in fired strength and will maintain an excellent adhesion to the substrate. In addition, by utilizing this type of alloy, it is possible to avoid the necessity for firing the conductive pigment in an essentially neutral atmosphere which is neither oxidizing nor reducing in nature and which would possibly require the presence of a reducing compound in order to prevent any oxidation.

As will be hereinafter shown in greater detail in the examples, it was totally unexpected that the addition of a greater amount of an oxidizable material such as boron to the alloy with the nonnoble conductive metal would increase the conductivity and conversely, reduce the resistivity of the alloy. By utilizing the oxidizable material of the type hereinbefore set forth in an amount in the range of from about 12% to about 25% by weight of the alloy, it is possible to obtain conductive pigments in which the resistivity of the pigment can be reproduced within a relatively small range, and in addition, provide an ink which cannot be readily removed from the surface of the substrate.

The following examples are given for purposes of illustrating a process for preparing conductive metal pigments from an alloy consisting of a nonnoble conductive metal and an oxidizable material. However, it is to be understood that these examples are given merely for purposes of illustration and are not intended to limit the generally broad scope of the present invention in strict accordance therewith.

EXAMPLE I

Conductive elements were prepared by mixing from about 80% to 90% of an alloy with from about 5% to about 20% of a vitreous frit and from about 5% to about 20% of a pine oil organic vehicle. The mixture was spread onto a 96% alumina chip and the resulting element was placed into a tube furnace. The firing schedule was to heat the device to a temperature ranging from about 1400° F. to about 1700° F. during a period of about 5 minutes in an air atmosphere. When the temperature reached the desired figure, the device was held thereat for a period of time ranging from 5 to about 10 minutes or more and thereafter was cooled to room temperature, usually at a rate of about 125° F. per minute. The resistivity measurements were then conducted using a 2-probe technique. Since the conductors were in sheet forms, sheet resistivity, which is measured in ohms per square area, was monitored.

To compare the improved properties which are to be found in alloys containing from about 12% to about 50% by weight of an oxidizable material in contrast to those alloys which contain from about 0.1% to about 10% by weight of an oxidizable material, a series of conductive pigments were prepared. The results of these tests are set forth in Table 1 below.

In the first set of tests, the alloy which was prepared comprised 95% nickel, 3.5% silicon and 1.5% boron, all percentages being by weight. In alloy A, the vitreous frit comprised a mixture of oxides of the following elements having an approximate concentration of 70% Si, 10% Ca, 10% Na and minor amounts of Mg, Fe and S, all percentages being by weight, while in alloys B, C, and D the vitreous frit comprised mixtures of oxides of the following elements having approximate concentrations of 65% Zn, 20% Sn and 15% B, all percentages being by weight. The alloys were fired for a period of time ranging from 6 to 12 minutes at temperatures ranging from 1400° to 1500° F. The resistance of the alloys was measured and an adhesion rating given thereto.

TABLE I

| Alloy | Firing Time Miuntes | Firing Temperature °F. | Resistivity Ohms/Square | Adhesion Rating |
|---|---|---|---|---|
| A | 6 | 1500 | 0.56* | 9 |
| B | 6 | 1400 | 0.12 | 6 |
| C | 6 | 1500 | infinite | 7 |
| D | 12 | 1400 | 0.064 | 8 |

*A green oxidation film formed on the surface of the conductor.

In contradistinction to the relatively low amounts of oxidizable material, that is about 5% of silicon and boron combined which was used in the preparation of the above conductive pigments, 3 additional pigments were prepared in a similar manner. In alloy E, 76.5% nickel was admixed with 26.5% by weight of boron and the resulting alloy was composited with vitreous frit comprising a mixture of oxides of the following elements having approximate concentrations of 65% Zn, 20% Sn and 20% B by weight. Alloys F and G were both prepared by admixing 88.5% nickel with 11.5% boron and the alloys composited with the vitreous frit used with Alloy E. The resulting pigments were then treated in a manner similar to that set forth above and the results are set forth in Table II below.

TABLE II

| Alloy | Firing Time Minutes | Firing Temperature °F. | Resistivity Ohms/Square | Adhesion Rating |
|---|---|---|---|---|
| E | 7.5 | 1700 | 0.112 | 9 |
| F | 7.5 | 1700 | 0.130 | 9 |
| G | 19 +2 | 1500 1700 | 0.111 | 9 |

It is to be noted from the above Tables that the conductive pigment containing an alloy in which the oxidizable material is present in an amount of about 11.5% or greater in the finished alloy possesses excellent characteristics as regards resistance and adhesion ratings. In addition, it is noted that oxidation began to occur for short firing times at 1500° F. when the alloy contained a relatively low boron content while a conductive pigment which contains a relatively high boron content, that is, about 11.5% or more, can be fired for a longer period of time at a higher temperature, the conductive pigment having no evidence of oxidation occurring during the firing. This resistance to oxidation is, as hereinbefore set forth, an extremely desirable feature of the conductive pigment.

Furthermore, it is also noted that all of the conductive pigments comprising an alloy consisting of nickel which contained a boron content greater than 10% possessed adhesion ratings of 9 which is in contrast to other conductive pigments comprising an alloy consisting of nickel, silicon and less than 10% boron which possessed adhesion ratings as low as 6. The adhesion was measured by a scotch tape pull test and by scratching the surface of the circuit with a pick. For the scratch test, a scale of 0 to 9 was assigned with 0 being an ink with no adhesion and 9 an ink which was virtually indestructible. The property of good adhesion is important in instances where the conductive pigment is subjected to wear or friction.

EXAMPLE II

To illustrate the advantages of utilizing an alloy containing a greater amount of a readily oxidizable material and specifically boron in an amount greater than 12%, a series of conductive elements were prepared. In the first series of elements, an ink was prepared by mixing 90% of an alloy consisting of 98.5% nickel and 1.5% of boron by weight with 10% by weight of vitreous frit, said frit comprising a mixture of oxides having an approximate concentration of 65% Zn, 20% Sn and 15% B, along with a carrier or organic vehicle which was of the terpineol type. The mixture was spread onto a 96% alumina chip and the resulting element was placed into a tube furnace. The substrate and ink deposit was heated from 77° F. to 1000° F. and held for a period of 5 minutes. Thereafter, the temperature was raised to 1310° F. and held for a period of 5 minutes, following which the temperature was raised to a peak 1690° F. and held for 10 minutes. At the end of this time, the element was cooled to 1310° F. for a period of 5 minutes, thereafter cooled to 1000° F. for an additional period of 5 minutes and then cooled to 77° F. for a total cycle time of thirty minutes, the firing atmosphere being air.

A second series of elements was prepared in a similar manner utilizing an alloy consisting of 85% nickel, 5% boron, while a third series of elements was prepared using an alloy consisting of 80% nickel and 20% boron.

Four conductors of each alloy were produced and the resistivity and scratch strength were measured on each conductor. The results of these tests are set forth in Table III below. The elements which were prepared from the alloy containing 1.5% by weight of boron are listed as A, B, C, and D; the elements prepared from the alloy containing 5% by weight of boron are listed as E, F, G and H, while the elements prepared from the alloy containing 20% by weight of boron are listed as I, J, K and L.

TABLE III
Results of the Testing of the Ni—B Alloy Based Nonnoble Metal Conductive Inks

| Test | Alloy % B | Resistivity Ohms Per Square | Scratch Strength |
|---|---|---|---|
| A | 1.5 | .1 | 3 |
| B | 1.5 | 2.0 | 3 |
| C | 1.5 | ∞ | 3 |
| D | 1.5 | .164 | 3 |
| E | 5 | .24 | 6 |
| F | 5 | .017 | 6 |
| G | 5 | .025 | 6 |
| H | 5 | .022 | 6 |
| I | 20 | .11 | 9 |
| J | 20 | .077 | 9 |
| K | 20 | .117 | 9 |
| L | 20 | .111 | 9 |

It is noted from the above table that the alloy which contained only 1.5% by weight of boron possessed the highest resistivity which at the same time was very unpredictable due to the extreme range of resistivity. The lowest average resistivity was found in those inks prepared from the alloy which contained 5% by weight of boron; however, the resistivity values were unpredictable and were not consistent in nature. In contrast to this, the resistivity of the ink containing the 20% by weight of boron alloy possessed a resistivity which was relatively predictable and which would be in the acceptable range for use in industry. Likewise, the table graphically illustrates the strength of the respective inks. It is noted that the ink containing the 1.5% by weight of boron alloy was easily damaged by scraping, the intermediate ink containing an alloy having 5% by weight of boron had an average strength, while the ink containing the alloy with 20% by weight of boron was almost indestructible in nature. Therefore, it is readily apparent that by utilizing a nonnoble metal ink with a pigment which contains a relatively high boron content, it is possible to increase the strength of the ink along with preparing a material which possesses a predictable resistivity.

EXAMPLE III

To further illustrate the advantages in utilizing an alloy which contains from about 15% to about 25% of an oxidizable material for use in a conductive pigment, an ink was prepared utilizing varying amounts of oxidizable materials in the alloy. In the first ink labeled A, an alloy consisting of 85% copper, 10% aluminum and 5% boron was admixed with a glass frit using a terpineol based carrier as the organic vehicle. The alloy comprised 90% by weight of the admixture, the remainder being the glass frit. A second ink was prepared and labeled B. This ink comprised an alloy of 85% copper, 10% aluminum and 5% boron. The alloy was admixed with a glass frit and boron powder, the weight percentage of each component comprising 75 wt. % alloy, 15 wt. % boron powder, and 10% glass frit. As in the preceding ink, a terpineol based carrier was used as the solvent. The third ink which was labeled C comprised an alloy consisting of 85 wt. % copper and 15 wt. % boron, the alloy comprising 90% by weight of the ink with 10% glass frit. The alloy and glass frit were again admixed in an organic vehicle comprising a terpineol based carrier.

In the test, two stripes with the approximate dimensions of 0.05 inch wide by 1.250 inch long by 0.006 inch thick were painted onto a 96% alumina electronic grade substrate. The circuits were fired using a tube furnace with an air atmosphere. The firing was effected by gradually heating the circuits at a controlled rate to a peak temperature ranging from about 1112° F. to about 1292° F., held at a peak temperature for approximately 10 minutes and thereafter allowed to cool at a controlled rate. The total firing time was effected during a period of 0.5 hour. The resistance of the circuits was measured using a Simpson 360 bolt-ohmmeter to the nearest 0.1 ohm. The resistivity (ohms per square) was calculated by dividing the resistance of each stripe by the length and multiplying by the average width. The results of these tests are set forth in Table IV below:

TABLE IV

| Conductive Ink | Peak Firing Temperature °F. | Resistivity Ohms per Sq. Average of Two | Adhesion Rating |
|---|---|---|---|
| A | 1112 | Infinity | 4 |
|   | 1292 | Infinity | 6 |
| B | 1112 | Infinity | 9 |
| C | 1112 | .0095 | 9 |
|   | 1292 | .011 | 9 |

As will be noted from the above Table, the only ink which possessed a controlled resistivity was the ink based on an alloy comprising 85% copper and 15% boron. The simple addition of boron powder to ink B was not sufficient to prevent the heavy oxidation of the ink. Inks A and B had no measurable conductivity and had discolored to a dark brown, while ink C which was based on an alloy comprising 85% copper and 15% boron maintained the bright red copper color. The results were unexpected inasmuch as an alloy of 85% copper and 15% boron did not have a high conductivity in the unfired state due to the high intermetallic compound content and therefore would not be an obvious choice as a conductor.

EXAMPLE IV

To illustrate the feasibility of preparing a conductive ink without using a glass frit as a binder, two inks were prepared, the first ink comprising an alloy consisting of 85% by weight of copper and 15% by weight of boron, the second ink containing an alloy consisting of 75% copper and 25% of boron. The alloy which comprised 95% by weight of the ink was admixed with an organic vehicle comprising a terpineol based carrier. As in Example III, two stripes with the approximate dimensions of 0.05" wide by 1.25" long by 0.006" thick were painted on an alumina substrate. The circuits were fired in an air atmosphere utilizing a tube furnace for the heating apparatus. The firing again was effected by gradually heating the circuits at a controlled rate to a peak temperature range from 1112° F. to about 1562° F., held at the peak temperature for approximately 10 minutes and thereafter allowed to cool at a controlled rate. The resistance of the circuit was measured in a manner similar to that hereinbefore set forth. The results of these tests are set forth in Table V below in which the ink containing 15% by weight of boron is labeled A and the ink containing 25% by weight of boron in the alloy is labeled B.

TABLE V

| Conductive Ink | Peak Firing Temperature °F. | Resistivity Ohm Per Sq. Average of 2 | Adhesion Rate |
|---|---|---|---|
| A | 1112 | 0.014 | 8 |
|  | 1292 | 0.004 | 8 |
|  | 1562 | 0.004 | 8 |
| B | 1112 | 0.047 | 8 |
|  | 1292 | 0.028 | 8 |
|  | 1562 | 0.022 | 8 |

It is therefore apparent from the above table that the conductive pigment may be prepared from an ink comprising only an alloy of a nonnoble conductive metal and an oxidizable material in an organic vehicle which binder acting as a carrier also acts as a binder. When utilizing the oxidizable material in an amount in the range of from about 12% to about 25% by weight, it is possible to obtain a conductive pigment with a resistivity within a controlled range as well as a conductive pigment possessing the ability to withstand removal from the surface of the substrate.

EXAMPLE V

In this example, two conductive inks were prepared, the first ink having a low boron content and the second ink containing a high boron content. The first ink was prepared without using a glass frit as a binder and comprised an alloy consisting of 98% copper and 2% boron admixed with an organic vehicle comprising a terpineol-based carrier, said conductive ink being labeled, C, the second ink containing an alloy consisting of 68% copper and 32% boron admixed with the same organic vehicle and labeled D. The inks were painted on an alumina substrate in a manner similar to that set forth in the above examples and the circuits were fired in an air atmosphere using a tube furnace for the heating apparatus. The firing was effected at a controlled rate at peak temperatures ranging from 1112° F. to about 1562° F.

At average peak firing temperature, the resistance of the circuit was measured in a manner similar to that set forth in the above examples. The results of these tests are set forth in Table VI below.

TABLE VI

| Conductive Ink | Peak Firing Temperature °F. | Resistivity Ohm per Sq. Ave. of Two | Adhesion Rate |
|---|---|---|---|
| C | 1112 | Infinity | 3 |
|  | 1292 | Infinity | 5 |
|  | 1562 | Infinity | 5 |
| D | 1112 | 13.9 | 9 |
|  | 1292 | 8.9 | 9 |
|  | 1562 | 7.4 | 9 |

It is readily apparent from a review of the data set forth in Table VI that conductive inks which possess either a low boron content or a high boron content are inappropriate for use as a conductive ink. While some boron is necessary to prevent an oxidation of the copper, the inherent high resistivity of the boron itself impairs the ink when an amount greater than about 25% is present in the ink. This higher resistivity is evident in the fact that inks containing 32% boron possessed such a degree of resistivity as to render the use of such an ink impractical. Likewise, when a relatively small amount of boron is present, there is practically no resistivity present and thus this type of ink is also impractical for use.

We claim as our invention:

1. A process for the preparation of a conductive pigment-coated surface having enhanced adhesion qualities and enhanced predictable resistivity which comprises alloying a nonnoble conductive metal with from about 12% to about 25% by weight of at least one oxidizable material selected from the group consisting of boron, boron-carbon and boron-silicon, mixing the resulting alloy with an organic vehicle to form an ink, screening said ink onto a substrate, thereafter firing said ink in an oxidizing atmosphere containing about 20% by volume of oxygen at a temperature in excess of about 1000° F. for a period of time sufficient to oxidize said oxidizable material without oxidation of said nonnoble metal, and cooling the thus fired product to produce conductive pigment-coated surface.

2. The process as set forth in claim 1 further characterized in that said ink contains a vitreous frit.

3. The process as set forth in claim 2 in which said frit is present in said ink in an amount in the range of from about 0.1 to about 20% by weight.

4. The process as set forth in claim 2 in which said vitreous frit is glass.

5. The process as set forth in claim 1 in which said nonnoble conductive metal is nickel.

6. The process as set forth in claim 1 in which said nonnoble conductive metal is copper.

7. The process as set forth in claim 1 in which said nonnoble conductive metal is aluminum.

8. The process as set forth in claim 1 in which said oxidizable material is boron.

9. The process as set forth in claim 1 in which said oxidizable material is boron-carbon.

10. The process as set forth in claim 1 in which said oxidizable material is boron-silicon.

11. The process as set forth in claim 1 in which said alloy comprises a mixture of nickel and boron.

12. The process as set forth in claim 1 in which said alloy comprises a mixture of copper and boron.

* * * * *